(12) United States Patent
Yasuda et al.

(10) Patent No.: US 8,638,031 B2
(45) Date of Patent: Jan. 28, 2014

(54) ORGANIC ELECTROLUMINESCENCE DEVICE

(75) Inventors: Hideki Yasuda, Kanagawa-ken (JP); Masayuki Naya, Kanagawa-ken (JP)

(73) Assignee: UDC Ireland Limited, Dublin (IE)

( * ) Notice: Subject to any disclaimer, the term of this patent is extended or adjusted under 35 U.S.C. 154(b) by 195 days.

(21) Appl. No.: 13/101,363

(22) Filed: May 5, 2011

(65) Prior Publication Data

US 2011/0204773 A1    Aug. 25, 2011

Related U.S. Application Data

(63) Continuation-in-part of application No. 12/700,167, filed on Feb. 4, 2010, now abandoned.

(30) Foreign Application Priority Data

Jan. 29, 2010    (JP) ................................. 2010-019047

(51) Int. Cl.
*H01J 1/62* (2006.01)
*H01J 63/04* (2006.01)

(52) U.S. Cl.
USPC .......................................... 313/504; 313/506

(58) Field of Classification Search
USPC ................................. 313/498–512
See application file for complete search history.

(56) References Cited

U.S. PATENT DOCUMENTS

| | | |
|---|---|---|
| 2005/0161693 A1 | 7/2005 | Sugiura et al. |
| 2006/0049745 A1 | 3/2006 | Handa et al. |
| 2007/0114523 A1 | 5/2007 | Oumi et al. |

FOREIGN PATENT DOCUMENTS

| | | |
|---|---|---|
| JP | 2007-165284 A | 6/2007 |
| WO | WO2010147586 | * 12/2010 |

OTHER PUBLICATIONS

Joseph R. Lakowicz et al., "Radiative Decay Engineering. 2. Effects of Silver Island Films on Flourescence Intensity, Lifetimes, and resonance Evergy Transfer", Analytical Biochemistry, 2002, pp. 261-277, vol. 301, No. 2.
Wening Li et al., "Emissive Efficienc Enhancement of Alq3 and Prospets for Plasmon-enhanced Oraganic Electroluminescence", Proc. of SPIE, 2008, pp. 703224-1-703224-7, vol. 7032.
"Enhanced Fluorescence by Surface Plasmon Coupling of Au Nonoparticles in an Organic Electroluminescence Diode", Applied Physics Letters, vol. 96, pp. 043307-1-043307-3, 2010.

* cited by examiner

*Primary Examiner* — Anh Mai
*Assistant Examiner* — Zachary J Snyder
(74) *Attorney, Agent, or Firm* — Morgan, Lewis & Bockius LLP

(57) ABSTRACT

An organic electroluminescence device having two electrodes and a plurality of organic layers between the two electrodes, in which the organic layers include a light emitting layer that emits light when an electric field is applied between the two electrodes. The device further includes a plurality of metal fine particles, which generates a local plasmon by light emitted from the light emitting layer, inside of at least either one of the electrodes or adjacent to a side of the electrode facing the organic layers and inside of a conductive organic layer, and at least some of the plurality of metal fine particles are disposed adjacent to the light emitting layer. Here, as the metal fine particles, particles having a scattering cross section $\sigma_S$ which is larger than an absorption cross section $\sigma_A$ thereof with respect to light emitted from the light emitting layer are used.

7 Claims, 3 Drawing Sheets

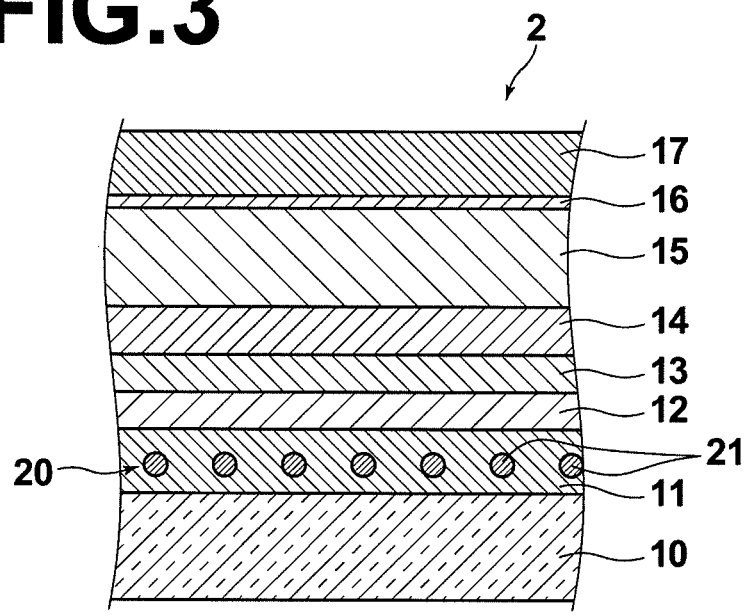
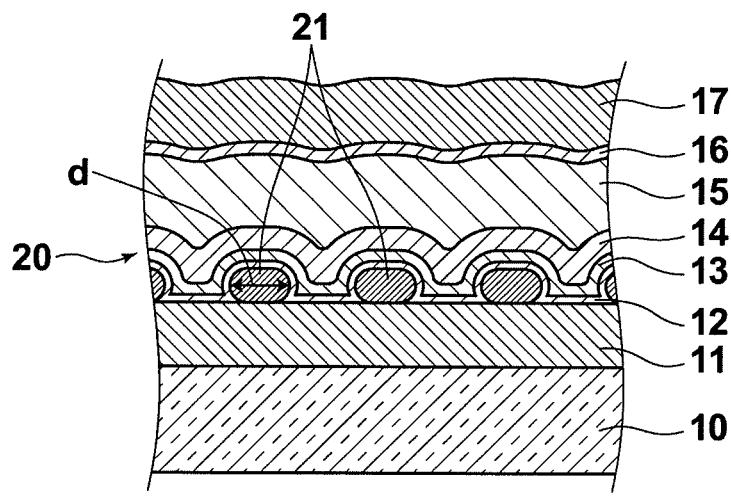

ORGANIC ELECTROLUMINESCENCE DEVICE

CROSS-REFERENCE TO RELATED APPLICATION

This application is a continuation-in-part application of U.S. patent application Ser. No. 12/700,167.

BACKGROUND OF THE INVENTION

1. Field of the Invention

The present invention generally relates to a light emitting device (electroluminescence device) that emits light when an electric field is applied and more particularly to an organic electroluminescence device with improved light emitting efficiency.

2. Description of the Related Art

Recently, organic EL has been drawing attention for use in illumination, display light sources, and the like. Light emitting materials used for organic EL, however, have a problem of low durability, which makes the organic EL difficult to be put into practical use.

It is known that organic materials inherently remain in exited state for a long time, whereby the chemical bonding of the materials is broken and the light emission performance is degraded with time. This low durability is a big challenge in employing an organic substance to a light emitting device.

Typically, organic EL devices have a structure in which an electrode layer and a plurality of organic layers are laminated on a substrate and light emitted from a light emitting layer is outputted through a transparent electrode. In this structure, the light incident on each interface between the layers on the light output side at an angle greater than the critical angle is totally reflected back and contained inside of the device, thereby unable to extract the light to the outside. Consequently, it is difficult to efficiently extract the emission light, and it is said that the light extraction efficiency is about 20% for a transparent electrode having a refractive index of ITO or the like which is being used commonly as a material of transparent electrode.

U.S. Patent Application Publication No. 20070114523 proposes a technique for improving the light extraction efficiency of an organic EL device by disposing a scattering layer which includes metal fine particles inside of the device and scattering the emission light.

In the mean time, J. R. Lakowicz et al., "Radiative decay engineering. 2. Effects of Silver Island Films on Fluorescence Intensity, Lifetimes, and Resonance Energy Transfer", Analytical Biochemistry, Vol. 301, Issue 2, pp. 261-277, 2002 describes that the exciton lifetime of a dye placed adjacent to a metal fine particle is reduced and the durability is improved. In relation to this, W. Li et al., "Emissive Efficiency Enhancement of $Alq_3$ and Prospects for Plasmon-enhanced Organic Electroluminescence", Proc. of SPIE, vol. 7032, pp. 703224-1-703224-7, 2008 proposes a method for enhancing emission of an organic light emitting device by disposing an island shaped metal near a light emitting layer. This emission enhancement is due to the fact that the dipole radiation from the light emitting device induces a surface plasmon (local plasmon) on the metal surface and energy is absorbed which is then reradiated as a new emission. That is, a new emission transition induced by the plasmon is added to the original emission process of the light emitting device, whereby advantageous effects of reducing the upper level lifetime (radiative lifetime) may be obtained. In this way, it is expected that the utilization of plasmon resonance may provide advantageous effects of improving the durability of the light emitting device through radiative lifetime reduction, as well as improving the light emission efficiency.

Further, A. Fujiki et al., "Enhanced fluorescence by surface plasmon coupling of Au nanoparticles in an organic electroluminescence diode", Applied Physics Letters, Vol. 96, pp. 043307-1-043307-3, 2010 reports that, in an EL device, plasmon enhancement effect was obtained for a light emitting material having a very low quantum efficiency value of $5.0 \times 10^{-8}$ to $2.0 \times 10^{-8}$ by disposing Au fine particles with a particle diameter of 12 nm adjacent to a transparent electrode (ITO) used as the anode of the device.

But, in W. Li et al., "Emissive Efficiency Enhancement of $Alq_a$ and Prospects for Plasmon-enhanced Organic Electraluminescence", Proc. of SPIE, vol. 7032, pp. 703224-1-703224-7, 2008, the emission enhancement due to the plasmon enhancement effect is confirmed only for photoexited light emitting devices (photoluminescence devices (PL devices)), and no report of successful example is found for field exited EL devices.

Further, A. Fujiki et al., "Enhanced fluorescence by surface plasmon coupling of Au nanoparticles in an organic electroluminescence diode", Applied Physics Letters, Vol. 96, pp. 043307-1-043307-3, 2010 describes that higher plasmon enhancement effect was obtained for lower quantum efficiency. It is generally known that the plasmon enhancement effect can be obtained in a case where the quantum efficiency is very low and A. Fujiki et al., "Enhanced fluorescence by surface plasmon coupling of Au nanoparticles in an organic electroluminescence diode", Applied Physics Letters, Vol. 96, pp. 043307-1-043307-3, 2010 does not describe plasmon enhancement effect for a material of high quantum efficiency.

SUMMARY OF THE INVENTION

The present invention has been developed in view of the circumstances described above, and it is an object of the present invention to provide an organic EL device capable of inducing plasmon enhancement effect even when a light emitting material of high quantum efficiency is used and has an improved durability by reducing the exciton lifetime.

An organic electroluminescence device of the present invention is a device, including two electrodes and a plurality of organic layers between the two electrodes, the organic layers including a light emitting layer that emits light when an electric field is applied between the two electrodes, wherein:

the device further includes a plurality of metal fine particles, which generates a local plasmon by light emitted from the light emitting layer, inside of at least either one of the two electrodes or adjacent to a side of the at least either one of the two electrodes facing the organic layers and inside of a conductive organic layer;

at least some of the plurality of metal fine particles are located adjacent to the light emitting layer; and a scattering cross section $\sigma_S$ of the metal fine particles with respect to emission light emitted from the light emitting layer is larger than an absorption cross section $\sigma_A$ of the metal fine particles with respect to the emission light.

The term "at least some of the plurality of metal fine particles are located adjacent to the light emitting layer" as used herein refers to that at least some of the metal fine particles are located at a distance from the light emitting layer close enough to cause plasmon resonance effect to occur by a local plasmon. Preferably, a shortest distance between some of the plurality of metal fine particles and the light emitting layer is not greater than 30 nm in order to cause plasmon resonance effect to occur.

The term "conductive organic layer" as used herein refers to an organic layer of the plurality of organic layers having conductivity and, more particularly, refers to a conductive organic layer, such as a hole injection layer, an electron injection layer, a hole transport layer, an electron transport layer, or the like disposed adjacent to the either one of the electrodes. In either case, the plurality of metal fine particles is disposed inside of a conductive layer.

Preferably, a maximum length d of the metal fine particles satisfies Formula (1) below:

$$d > \sqrt[3]{\frac{3\lambda^3 \text{Im}\left[\frac{\hat{n}^2-1}{\hat{n}^2+1}\right]}{4\pi^3 n^3 \text{Abs}\left[\frac{\hat{n}^2-1}{\hat{n}^2+1}\right]^2}} \quad (1)$$

$$\hat{n} = n_{particle}/n$$

where, $\lambda$ is an emission wavelength, n is a refractive index of the conductive layer, and $n_{particle}$ is a complex refractive index of the metal fine particles.

Preferably, the maximum length of the metal fine particles d is greater than a mean free path of electrons in a metal constituting the metal fine particles.

Preferably, the light emitting layer is formed of an organic phosphor material.

The metal fine particles may have any shape, such as a spherical shape, an oval spherical shape, a rod shape, or the like. The term "maximum length d" as used herein refers to a diameter in the case of a spherical shape and a major axis in the case of an oval spherical shape.

As for the material of the metal fine particles, any material may be used as long as it is capable of generating a plasmon resonance by the emission light, and a metal, such as Ag (silver), Au (gold), Pt (platinum), Cu (copper), Al (aluminum), or the like, or an alloy that includes one of these metals as the major component is preferably used. The term "major component" as used herein refers to a component with a content of 80% by mass or more.

The either one of the electrodes may be an anode or a cathode. Further, the either one of the electrodes may be formed of a metal or a transparent conductive material. Examples of transparent conductive materials include ITO (indium titanium oxide), ZnO (zinc oxide), and the like.

When the either one of the electrodes is formed of a metal, it may be a semi-transmissive metal electrode formed of Ag, Mg, or an alloy that includes one of these metals as the major component, or it may be an opaque metal electrode formed of Al, Mg, Ag, Cu, Ca, or an alloy that includes one of these metals as the major component.

Further, the either one of the electrodes may be formed of a conductive material which is less likely to generate a surface plasmon by the emission light than a metal constituting the metal fine particles.

The disposition of the metal fine particles may be at random or periodic.

It is preferable that the plurality of metal fine particles accounts for not less than 5% of an area of the either one of the electrodes. The term "the plurality of metal fine particles accounts for not less than 5% of the area of the either one of the electrodes" as used herein refers to that, when the plurality of metal fine particles is projected onto the electrode surface, the projected image of the plurality of metal fine particles accounts for not less than 5% of the area of the electrode surface.

Preferably, in the organic electroluminescence device of the present invention, the either one of the electrodes is formed on a substrate.

The present inventors have studied for effectively inducing plasmon enhancement effect for a light emitting material of high quantum efficiency, such as a phosphor material, which has led to the present invention. As described above, the plasmon enhancement effect is effective for a light emitting material of very low quantum efficiency, but the achievement of plasmon enhancement effect for a material of high quantum efficiency has not been discussed. Focusing attention on this point not considered important heretofore, the present inventors have found out the conditions for effectively inducing plasmon enhancement effect for a light emitting material of high quantum efficiency.

The organic electroluminescence device of the present invention includes a plurality of metal fine particles, which generates a local plasmon by emission light emitted from the light emitting layer, inside of at least either one of the two electrodes or adjacent to a side of the at least either one of the two electrodes facing the organic layers and inside of a conductive organic layer, and at least some of the plurality of metal fine particles are located adjacent to the light emitting layer. This may provide both the emission enhancement and exciton lifetime reduction by the emission transition caused by the plasmon. That is, by reducing, as plasmon enhancement effect, the time of exciton state having a high reactivity with an environmental substance, the durability of the device may be improved. Further, a scattering cross section $\sigma_S$ of the metal fine particles with respect to emission light emitted from the light emitting layer is larger than an absorption cross section $\sigma_A$ of the metal fine particles with respect to the emission light. This may effectively induce plasmon enhancement effect for a light emitting material of high quantum efficiency.

Provision of metal fine particles that satisfy the condition that a scattering cross section $\sigma_S$ thereof with respect to emission light emitted from a light emitting layer is larger than an absorption cross section $\sigma_A$ thereof with respect to the emission light, as in the EL device of the present invention, may induce plasmon enhancement effect not only for a light emitting material of high quantum efficiency but also for a light emitting material of low quantum efficiency.

Further, the organic electroluminescence device of the present invention has a structure in which metal fine particles are provided inside of an electrode or adjacent to the electrode. This may simplify the manufacturing process in comparison with a structure in which metal fine particles are provided inside of an organic layer located away from the electrode.

BRIEF DESCRIPTION OF THE DRAWINGS

FIG. 3 is a cross-sectional view of an organic EL device according to a second embodiment of the present invention, schematically illustrating the layer structure thereof.

FIG. 4 is a cross-sectional view of an organic EL device of Example 1, schematically illustrating the layer structure thereof.

DESCRIPTION OF THE PREFERRED EMBODIMENTS

Figure 1:
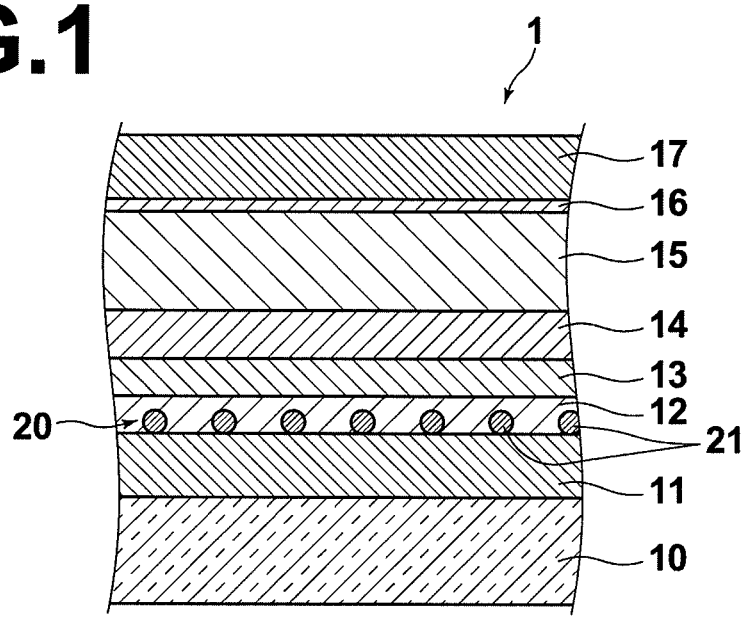
FIG. 1 is a cross-sectional view of an organic EL device according to a first embodiment of the present invention, schematically illustrating the layer structure thereof.

Hereinafter, electroluminescence devices (EL devices) according to embodiments of the present invention will be described with reference the accompanying drawings. In the drawings, each component is not drawn to scale in order to facilitate visual recognition.

First Embodiment

FIG. 1 is a cross-sectional view of organic EL device 1 according to a first embodiment of the present invention, schematically illustrating the structure thereof.

Organic EL device 1 of the present embodiment includes transparent substrate 10, formed of a glass or the like, on which anode 11 having an optical transparency, hole injection layer 12, hole transport layer 13, light emitting layer 14, electron transport layer 15, electron injection layer 16, and cathode 17 are laminated in this order. Device 1 further includes a metal structure 20 formed of metal fine particles 21 that generate plasmon resonance by the light emitted from light emitting layer 14. Metal fine particles 21 are disposed so as to contact the surface of anode 11 and hole injection layer 12, which is a conductive organic layer, is filled between metal fine particles 21. As for metal fine particles 21, particles having a scattering cross section $\sigma_S$ with respect to emission light emitted from light emitting layer 14 which is larger than an absorption cross section $\sigma_A$ thereof with respect to the emission light are provided.

Organic EL device 1 is structured such that the light emitted from light emitting layer 14 when an electric field is applied between electrodes 11 and 17 exits from the side of anode 11.

Note that FIG. 1 is a schematic view of organic EL device 1 and metal fine particles are depicted such that they are completely embedded in hole injection layer 12 and the upper surface of the hole injection layer 12 is flat. But, in an actual device produced by a manufacturing method to be described later, hole injection layer 12 is formed along the surfaces of particles 21. Consequently, the upper surface (lamination plane) of the hole injection layer is waved along particles 21, the upper surface of each layer further laminated thereon is also waved accordingly. As the layer thickness from the particles increases, the degree of waviness of the lamination plane is moderated.

Light emitting layer 14 is a light emitting area that emits light through the recombination of electrons and holes injected from anode 11 and cathode 17. There is not any specific restriction on the material of light emitting layer 14 as long as it is applicable to the light emitting layer of an organic EL device and a material may be selected according to a desired emission wavelength. But, the present invention is particularly effective for a light emitting layer material of high quantum efficiency, and it is preferable to use a phosphor material with a quantum efficiency value of not less than 0.5.

Anode 11 may be a transparent electrode formed of a transparent conductive material such as ITO or ZnO. Alternatively, it may be a semi-transmissive metal electrode formed of Ag, Mg or an alloy that includes one of these metals as the major component. In the case of a metal electrode, the optical transparency is provided by thinly forming the electrode.

Metal fine particles 21 may be any particles as long as they have a scattering cross section $\sigma_S$ with respect to emission light emitted from light emitting layer 14 which is larger than an absorption cross section $\sigma_A$ thereof with respect to the emission light. The scattering cross section $\sigma_S$ and absorption cross section $\sigma_A$ vary according to the direction of the incident light. Here, the condition $\sigma_S > \sigma_A$ needs to be satisfied with respect to the emission light from any one of the directions. It is particularly preferable, however, that the condition $\sigma_S > \sigma_A$ is satisfied with respect to the emission light from each direction. The larger scattering cross section $\sigma_S$ of metal fine particles 21 with respect to emission light emitted from light emitting layer 14 than the absorption cross section $\sigma_A$ thereof with respect to the emission light may induce enhancement effect of plasmon even for a phosphor material of high quantum efficiency.

The particle diameter (maximum length d) of metal fine particles 21 may be any value as long as it satisfies the condition described above, but a preferable maximum length d that satisfies the condition described above is expressed by Formula (1) below.

$$d > \sqrt[3]{\frac{3\lambda^3 \text{Im}\left[\frac{\hat{n}^2 - 1}{\hat{n}^2 + 1}\right]}{4\pi^3 n^3 \text{Abs}\left[\frac{\hat{n}^2 - 1}{\hat{n}^2 + 1}\right]^2}} \quad (1)$$

$$\hat{n} = n_{particle}/n$$

where, $\lambda$ is an emission wavelength, n is a refractive index of the conductive layer, and $n_{particle}$ is a complex refractive index of the metal fine particles.

In Formula (1) above, Im represents an imaginary part and Abs represents an absolute value. Formula (1) above is derived from an approximation formula of Rayleigh scattering that holds true when the particle size of the metal fine particles may induce local plasmon (when the particle diameter is smaller than the emission light wavelength). Metal fine particles having a particle diameter that satisfies the formula above may induce the plasmon enhancement effect more efficiently for a light emitting material of high quantum efficiency.

Preferably, the particle diameter (maximum length) d of metal fine particles 21 is greater than a mean free path of electrons in the metal of the metal fine particles. This prevents absorption of emission light by the metal and causes the enhancement by the plasmon to be more effective.

Metal fine particles 21 may be disposed periodically or at random.

As for the material of metal fine particles 21, any material capable of generating a surface or local plasmon resonance by light emitted from light emitting layer 14 may be used, and Au, Ag, Pt, Cu, Al, or an alloy having one of them as the major component may preferably be used.

Further, a plurality of metal fine particles is disposed at a distance from light emitting layer 14 close enough to induce plasmon resonance effect in the light emitting layer by the local plasmon and at least some of the particles are located adjacent to light emitting layer 14. A too long distance from light emitting layer 14 results in a plasmon resonance by emission light becomes difficult to occur, so that the emission enhancement effect cannot be obtained. Thus, it is preferable that at least some of a plurality of metal fine particles are placed at a distance of not greater than 30 nm from light emitting layer 14. The distance between metal fine particles and light emitting layer 14 as used herein refers to a distance closest between each portion thereof (shortest distance).

On the other hand, if metal fine particles 21 is in contact with light emitting layer 14 or in proximity to light emitting layer 14 at a distance "d" less than 5 nm, charge migration occurs directly from light emitting layer 14 and emission decay is highly likely to occur. Thus, it is preferable that metal fine particles are placed away from light emitting layer 14 at a distance greater than 5 nm.

Figure 2:
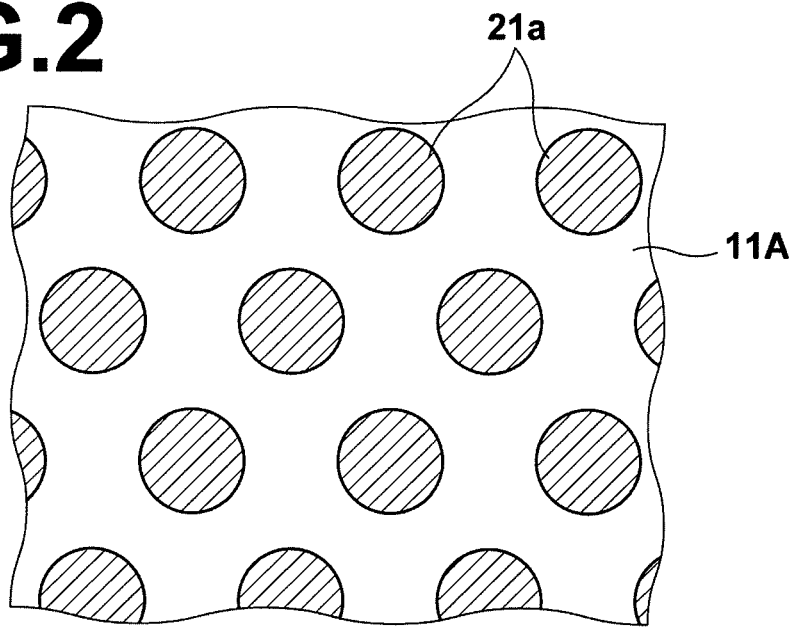
FIG. 2 is a drawing for explaining the ratio of the metal structure to the electrode area.

When metal structure 20 constituted by a plurality of metal fine particles 21 is projected onto the surface of electrode 11, it is preferable that the projected image of the metal structure accounts for 5% or more of the area of the electrode surface. FIG. 2 illustrates projected images 21a of the particles constituting metal structure 20 projected on surface 11A of electrode 11. As shown in FIG. 2, it is preferable that the projected images 21a account for 5% or more of the area of electrode surface 11A. If the ratio of the projected image of metal structure to the area of the electrode surface is too small, a plasmon resonance between the fine particles and light emitted from light emitting layer 14 becomes difficult to occur, so that the emission enhancement effect and durability improvement effect through radiative lifetime reduction can not be obtained. Thus, it is preferable that the ratio is not smaller than 5%. If the metal structure is provided on the electrode on the light output side, it is necessary to provide a gap between the particles so that a transmittance of about 40% is ensured for the light emitted from light emitting layer 14 in order to output the emission light. If the metal structure is provided on the electrode not on the light output side, on the other hand, the ratio of projected image of the metal structure to the electrode surface may be 100%.

Organic EL device 1 of the present invention includes metal structure 20 constituted by the metal fine particle film described above and placed such that a portion thereof is located adjacent to light emitting layer 14 (at a distance not greater than 30 nm), whereby emission enhancement effect and upper level lifetime (radiactive lifetime) reduction effect may be obtained by a plasmon resonance between the emission light and metal fine particles 21. This may improve the light emission efficiency and durability through the radiactive lifetime reduction.

Metal structure 20 constituted by metal fine particles 21 may be formed, after forming anode 11 formed of a transparent material, such as ITO or the like, on substrate 10, by depositing a metal layer on anode 11 with a thickness of about 10 nm and annealing the metal layer at a predetermined temperature.

The organic EL device of the present embodiment may be manufactured, after forming anode 11 on substrate 10 and metal structure 10 in the manner as described above, by serially laminating, through deposition, hole injection layer 12, hole transport layer 13, light emitting layer 14, electron transport layer 15, electron injection layer 16, and cathode 17 on anode 11 having metal structure 20.

As described above, the organic EL device of the present embodiment includes a metal structure constituted by a plurality of metal fine particles adjacent to anode 11 on substrate 10 and organic layers 12 to 16 are formed to embed the metal structure, so that the organic EL device may be manufactured by a simple manufacturing process.

In the embodiment described above, each organic layer, such as hole injection layer 12, hole transport layer 13, light emitting layer 14, electron transport layer 15, or electron injection layer 16, may be formed of a material selected from those which are known to have the respective functions. Further, the organic EL device may further include a hole blocking layer, an electron blocking layer, a protection layer, and the like.

The organic EL device according to the first embodiment described above has a lamination structure in which the anode electrode is formed first on glass substrate 10, but identical effects may be obtained when the device is configured to have a lamination structure in which the cathode electrode is formed first on substrate 10 and a plurality of metal fine particles is provided on the cathode electrode if the metal structure is formed such that at least a portion thereof is placed adjacent to the light emitting layer.

The organic EL device according to the first embodiment described above includes a transparent electrode on substrate 10 and is configured to output emission light from the substrate side. Alternatively, the device may include an opaque metal electrode of Al, Mg, Ag, Cu, Ca, or the like on substrate 10 and an electrode that transmits the emission light on the organic layers, and is configured to output the emission light from a face opposite to the substrate.

Further, in the organic EL device according to the first embodiment, metal fine particles 21 are provided on anode 11 on the organic layer side and embedded in hole injection layer 21, which is a conductive organic layer. But, metal fine particles may be provided inside of anode 11.

Second Embodiment

FIG. 3 is a cross-sectional view of organic EL device 2 according to a second embodiment of the present invention, schematically illustrating the structure thereof. Components identical to those of the organic EL device 1 in drawings that will be described hereinafter are given the same reference numerals.

Organic EL device 2 differs from organic EL device 1 according to the first embodiment in that metal structure 20 constituted by a plurality of metal fine particles 21 is disposed inside of anode 11 instead of on a surface of anode 11. In organic EL device 2, metal fine particles inside of anode 11 are disposed at a distance from light emitting layer 14 close enough to induce a plasmon resonance by the light emitted from light emitting layer 14.

In the present embodiment, anode 11 is formed of a transparent conductive material that does not generate a surface or local plasmon by the light emitted from light emitting layer 14 or a metal which is more unlikely to generate a surface or local plasmon by the emission light than the metal of metal fine particles 21. In doing so, metal fine particles 21 and anode 11 become clearly distinguishable from each other because of the material difference and the advantageous effect of metal structure 20 appears more significantly.

Organic EL device 2 of the present embodiment includes metal structure 20 constituted by the metal fine particle film and placed such that a portion thereof is located adjacent to light emitting layer 14 as in the first embodiment, so that emission enhancement effect and upper level lifetime (radiactive lifetime) reduction effect, which improves the durability of the device, may be obtained by a plasmon resonance between the light emitted from light emitting layer 14 and metal fine particles.

One specific method for disposing a plurality of metal fine particles 21 inside of a transparent conductive material may be a method in which a transparent electrode is formed on a substrate, then a metal layer is formed thereon and annealed at a predetermined temperature to form multiple metal fine particles, and a transparent electrode is further formed to cover the multiple metal fine particles.

As described above, in organic EL device 2 of the present embodiment, a metal structure is provided inside of anode 11 on substrate 10, so that the organic EL device may be manufactured by a simple manufacturing process.

In each aforementioned embodiment, the description has been made of a case in which metal fine particles 21 have a spherical shape, but they need only to be granular and may have an oval spherical shape, a rod shape, or the like.

In each of aforementioned embodiments, the description has been made of a case in which the device has metal structure 20, constituted by a plurality of metal fine particles, formed on or inside of only one of electrodes 11 and 17 but metal structure 20 may be formed on or inside of each of electrodes 11 and 17.

EXAMPLES

Examples and Comparative Examples of the organic EL device of the present invention were produced and the following experiments were performed.

Example 1

A glass substrate was used as transparent substrate 10 and a green organic EL device of Example 1 was produced by depositing the following in the order described below. FIG. 4 is a cross-sectional view of the organic EL device of Example 1, schematically illustrating the layer structure thereof.

First, an ITO film was formed on glass substrate 10 as anode 11 with a thickness of 100 nm. Then, an Ag film was deposited on the ITO film with a thickness of 12 nm and the Ag film was heated (annealed) at 300° C. for 60 minutes under $N_2$ environment to obtain fine particle film (metal structure) 20 constituted by a plurality of Ag fine particles with a particle diameter of 80 to 120 nm. Thereafter, as hole injection layer 12, 2-TNATA (4,4,4-Tris (2-naphthylphenylamino) triphenylamine) and F4-TCNQ were deposited with a thickness of 10 nm such that F4-TCNQ becomes 0.3%. Then, as hole transport layer 13, NPD (N,N'-dinaphthyl-N,N'-diphenyl [1,1'-biphenyl]) was deposited with a thickness of 10 nm and further, as light emitting layer 14, CBP-10% Ir(ppy)$_3$ was formed with a thickness of 30 nm. Then, as electron transport layer 15, BAlq was formed with a thickness of 150 nm, as electron injection layer 16, LiF was formed with a thickness of 1 nm, and as cathode 17, Al was formed with a thickness of 100 nm. In a layer in which two or more types of materials are co-deposited, the deposition speed of a material of a smaller concentration was adjusted to obtain a desired concentration. The deposition speed was measured using a crystal oscillator. The stacked body produced was put in a glove box replaced with a nitrogen gas and sealed using a glass plate and an ultraviolet cure adhesive, whereby the manufacture of the organic EL device of Example 1 was completed.

The light emitting material, Ir(ppy)$_3$, of the present device is a green phosphor material with a quantum efficiency value of 0.85. The scattering cross section $\sigma_S$ of the Ag fine particles with a particle diameter of 80 nm in the organic layer (refractive index of 1.7) with respect to emission light wavelength, i.e., the peak wavelength (515 nm) of Ir(ppy)$_3$ is $\sigma_S$=0.31582 [$\mu m^2$], while the absorption cross section is $\sigma_A$=0.004886 [$\mu m^2$]. When the particle diameter of the Ag fine particles is 120 nm, then the scattering cross section $\sigma_S$=0.052894 [$\mu m^2$], while the absorption cross section is $\sigma_A$=0.009584 [$\mu m^2$]. Here, in either case, the condition $\sigma_S>\sigma_A$ is satisfied.

Comparative Example 1-1

An organic EL device having a structure similar to that of Example 1 but without having the Ag particle film (metal structure) 20 was manufactured as Comparative Example 1-1 by the manufacturing process similar to that of Example 1 except for the Ag deposition and annealing at 300° C.

Comparative Example 1-2

An organic EL device having a structure similar to that of Example 1 except that it includes Ag fine particles with a particle diameter of 20 to 30 nm instead of Ag fine particles with a particle diameter of 80 to 120 nm was manufactured as Comparative Example 1-2. That is, Comparative Example 1-2 includes Ag fine particles with a smaller particle diameter in comparison with Example 1. The manufacturing process was similar to that of Example 1 other than the metal structure forming step. Here, Ag was deposited on ITO with a thickness of 4 nm and heated (annealed) at 300° C. for 60 minutes under $N_2$ environment to obtain fine particle film (metal structure) 20 of Ag fine particles 21 with a particle diameter of 20 to 30 nm. Other manufacturing steps were identical to those of Example 1.

The scattering cross section $\sigma_S$ of the Ag fine particles with a particle diameter of 20 nm in the organic layer (refractive index of 1.7) with respect to emission light wavelength, i.e., the peak wavelength (515 nm) of Ir(ppy)$_3$ is $\sigma_S$=2.19×10$^{-5}$ [$\mu m^2$], while the absorption cross section is $\sigma_A$=0.000171 [$\mu m^2$]. When the particle diameter of the Ag fine particles is 30 nm, then the scattering cross section $\sigma_S$=0.000327[$\mu m^2$], while the absorption cross section is $\sigma_A$=0.000766 [$\mu m^2$]. Here, in either case, $\sigma_S<\sigma_A$.

Comparative Example 1-3

Figure 5:
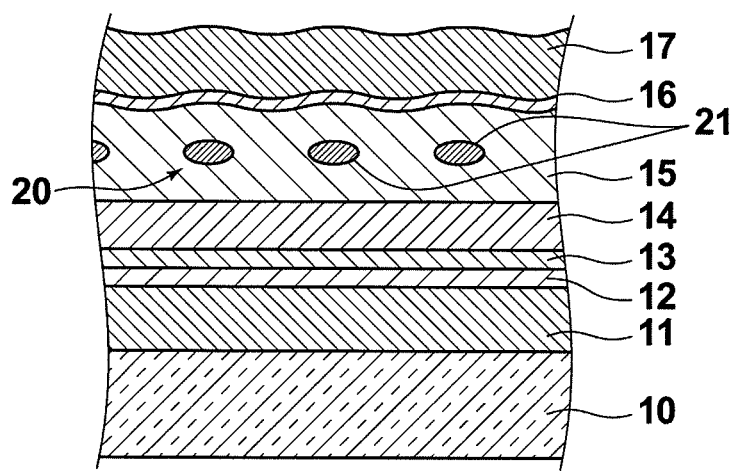
FIG. 5 is a cross-sectional view of an organic EL device of Comparative Examples 1-3, schematically illustrating the layer structure thereof.

An organic EL device having a structure similar to that of Example 1 except that it includes Ag fine particles, with a particle diameter of 40 to 50 nm, disposed 50 nm away from the light emitting layer instead of Ag fine particles, with a particle diameter of 80 to 120 nm, disposed adjacent to the electrode was manufactured as Comparative Example 1-3. FIG. 5 is a cross-sectional view of the organic EL device of Comparative Examples 1-3, schematically illustrating the layer structure thereof.

Comparative Example 1-3 was produced by a manufacturing process similar to that of Example 1 except that the Ag deposition and annealing at 300° C. were omitted and, in the process of depositing BAlq with a thickness of 150 nm, as electron transport layer 15, BAlq was deposited with a thickness of 50 nm, then Ag was deposited on the BAlq layer with a thickness of 10 nm, and BAlq was further deposited with a thickness of 100 nm.

The scattering cross section $\sigma_S$ of the Ag fine particles with a particle diameter of 40 nm in the organic layer (refractive index of 1.7) with respect to emission light wavelength, i.e., the peak wavelength (515 nm) of Ir(ppy)$_3$ is $\sigma_S$=0.002586 [$\mu m^2$], while the absorption cross section is $\sigma_S$=0.002602 [$\mu m^2$]. When the particle diameter of the Ag fine particles is 50 nm, then the scattering cross section $\sigma_S$=0.011887 [$\mu m^2$], while the absorption cross section is $\sigma_A$=0.006263 [$\mu m^2$]. Here, the condition $\sigma_S>\sigma_A$ is satisfied when the particle diameter is 50 nm, but when the diameter is 40 nm, $\sigma_S<\sigma_A$.

Example 2

A glass substrate was used as transparent substrate 10 and a red organic EL device of Example 2 was produced by depositing the following in the order described below.

First, an ITO film was formed on glass substrate 10 as anode 11 with a thickness of 100 nm. Then, an Ag film was deposited on the ITO film with a thickness of 12 nm and the Ag film was heated (annealed) at 300° C. for 60 minutes under $N_2$ environment to obtain fine particle film (metal structure) 20 constituted by a plurality of Ag fine particles with a particle diameter of 80 to 120 nm. Thereafter, as hole injection layer 12, $MoO_3$ was deposited with a thickness of 10 nm. Then, as hole transport layer 13, NPD (N,N'-dinaphthyl-N, N'-diphenyl [1,1'-biphenyl]) was deposited with a thickness of 7 nm and further, as a blocking layer, compound 1 was deposited with a thickness of 3 nm. Thereafter, the following layers were deposited in the following order: as light emitting layer 14, compound 2-5% compound 3 were formed with a thickness of 30 nm; as electron transport layer 15, BAlq was formed with a thickness of 55 nm; as electron injection layer 16, LiF was formed with a thickness of 1 nm; and as cathode 17, Al was formed with a thickness of 100 nm. As in Example 1, in a layer in which two or more types of materials are co-deposited, the deposition speed of a material of a smaller concentration was adjusted to obtain a desired concentration, and the deposition speed was measured using a crystal oscillator. The stacked body produced was put in a glove box replaced with a nitrogen gas and sealed using a glass plate and an ultraviolet cure adhesive, whereby the manufacture of the organic EL device of Example 2 was completed.

Compounds 1 to 3 described above are compounds represented by the following chemical structural formulae respectively.

COMPOUND 1

NL02824

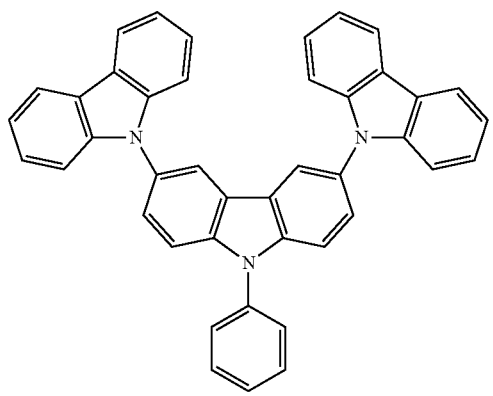

COMPOUND 2

NL05119

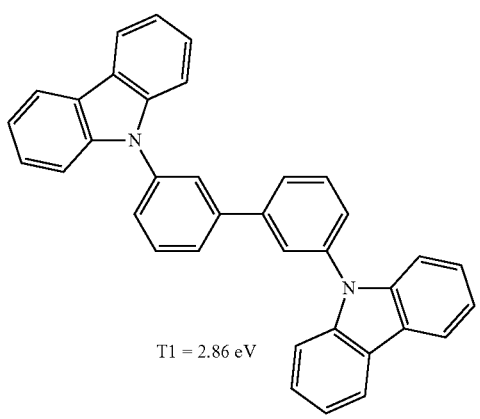

T1 = 2.86 eV

-continued

COMPOUND 3

NL02340

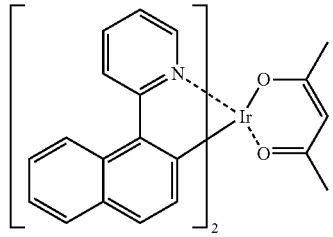

The light emitting material, compound 3, of the present device is a red phosphor material with a quantum efficiency value of 0.6. The scattering cross section $\sigma_S$ of the Ag fine particles with a particle diameter of 80 nm in the organic layer (refractive index of 1.7) with respect to emission light wavelength, i.e., the peak wavelength (610 nm) of compound 3 is $\sigma_S=0.028206$ [$\mu m^2$], while the absorption cross section is $\sigma_A=0.003953$ [$\mu m^2$]. When the particle diameter of the Ag fine particles is 120 nm, then the scattering cross section $\sigma_S=0.057049$ [$\mu m^2$], while the absorption cross section is $\sigma_A=0.00348$ [$\mu m^2$]. Here, in either case, the condition $\sigma_S>\sigma_A$ is satisfied.

Comparative Example 2-1

An organic EL device having a structure similar to that of Example 1 but without having the Ag particle film (metal structure) 20 was manufactured as Comparative Example 2-1 by the manufacturing process similar to that of Example 1 except for the Ag deposition and annealing at 300° C.

Comparative Example 2-2

An organic EL device having a structure similar to that of Example 2 except that it includes Ag fine particles with a particle diameter of 20 to 30 nm instead of Ag fine particles with a particle diameter of 80 to 120 nm was manufactured as Comparative Example 2-2. That is, Comparative Example 2-2 includes Ag fine particles with a smaller particle diameter in comparison with Example 2. The manufacturing process was similar to that of Example 2 other than the metal structure forming step. Here, Ag was deposited on ITO with a thickness of 4 nm and heated (annealed) at 300° C. for 60 minutes under $N_2$ environment to obtain fine particle film (metal structure) 20 of Ag fine particles 21 with a particle diameter of 20 to 30 nm. Other manufacturing steps were identical to those of Example 2.

The scattering cross section $\sigma_S$ of the Ag fine particles with a particle diameter of 20 nm in the organic layer (refractive index of 1.7) with respect to emission light wavelength, i.e., the peak wavelength (610 nm) of compound 3 is $\sigma_S=3.39\times 10^{-6}$ [$\mu m^2$], while the absorption cross section is $\sigma_A=2.66\times 10^{-5}$ [$\mu m^2$]. When the particle diameter of the Ag fine particles is 30 nm, then the scattering cross section $\sigma_S=4.29\times 10^{-5}$ [$\mu m^2$], while the absorption cross section is $\sigma_A=0.000101$ [$\mu m^2$]. Here, in either case, $\sigma_S<\sigma_A$.

Example 3

An organic EL device having a structure similar to that of Example 2 except that electron transport layer 15 was formed thick with a thickness of 230 nm as Example 3 by the manufacturing process similar to that of Example 2 except that BAlq was deposited with a thickness of 230 nm as the electron transport layer.

Comparative Example 3

An organic EL device having a structure similar to that of Example 3 but without having Ag particle film (metal structure) 20 was manufactured as Comparative Example 3 by the manufacturing process similar to that of Example 3 except for the Ag deposition and annealing at 300° C.

In each device of Examples and Comparative Examples, the light emitting layer is designed so as to substantially corresponds to the antinode of the standing wave of emission light (position where the electric field by the standing wave becomes maximum) that occurs between the electrodes in order to obtain cavity effect between the electrodes. Examples 1 and 2 were designed for the standing wave of fundamental oscillation and Example 3 was designed for the standing wave of double oscillation. In each device, the size of Ag fine particles was confirmed by observing the cross-section of the device with SEM (scanning electron microscope). Ag fine particles had substantially an oval spherical shape.

<Emission Lifetime Measurements>

Each organic EL device of Examples and Comparative Examples is irradiated with nitrogen laser light (wavelength 337 nm, pulse with 1 ns), as the excitation light, and the lifetime of emission from each light emitting material was measured with a streak camera (C4334, Hamamatsu Photonics K.K., Japan).

<EL External Quantum Efficiency Measurements>

A DC current was applied to each organic EL device to cause the device to emit light using a source measure unit 2400 (Toyo Corporation) and the emission spectrum was measured using a spectroradiometer SR-3 (Topcon Corporation). External quantum efficiency of each device was measured at a current density of 0.25 mA/cm2 by an intensity conversion method with respect to each wavelength.

<EL Operation Half-Lifetime Measurements>

A DC current value that causes each organic EL device of Examples and Comparative Examples to provide a luminance of 2000 cd/m² was measured and each device was continuously operated with the current value to measure the time from the start to the time when the luminance is reduced to 1000 cd/m².

The external quantum efficiency, emission lifetime and EL operation half-lifetime of each device are shown in Table 1. It has been confirmed that Example 1 has a high external quantum efficiency value, a shorter emission lifetime, and a longer EL operation durability in comparison with Comparative Example 1-1 that does not include Ag particles, Comparative Example 1-2 that does not satisfy the condition of scattering cross section $\sigma_S$>absorption cross section $\sigma_A$, and Comparative Example 1-3 having Ag particles disposed in the light emitting layer, as shown in Table 1.

It has also been confirmed that Example 2 of red device has a high external quantum efficiency value, a shorter emission lifetime, and a longer EL operation durability in comparison with Comparative Example 2-1 that does not include Ag particles and Comparative Example 2-2 that does not satisfy the condition of scattering cross section $\sigma_S$>absorption cross section $\sigma_A$. Further, it has been confirmed that increased thickness of the electron transport layer, as in Example 3, may provide identical effects.

From Example 1 and Comparative Examples 1-1, 1-2, and Example 2 and Comparative Examples 2-1, 2-2, it is known that Comparative Examples 1-2 and 2-2 that include metal fine particles with a particle diameter of 20 to 30 nm, which have been thought to induce favorable plasmon enhancement effect for a material having low quantum efficiency, have the external quantum efficiency and durability both lower than those of Comparative Examples 1-1 and 2-1 that do not include fine particles. For materials of high quantum efficiency values of 0.85 and 0.6 used in Examples and Comparative Examples, it has become clear that metal fine particles with a particle diameter of 20 to 30 nm do not provide plasmon enhancement effect or rather causes degraded characteristics. This might be due to large absorption of emission light by the metal fine particles, since the scattering cross section is smaller than the absorption cross section for the particle diameter of 20 to 30 nm.

In the mean time, Examples 1, 2, and 3 that include metal fine particles satisfying the condition of the present invention that the scattering cross section is larger than the absorption cross section have both improved external quantum efficiency and durability, showing that the plasmon enhancement effect is effectively induced.

TABLE 1

| | E/Quantum Efficiency (%) | Emission Lifetime(μs) | EL Operation Half-lifetime (h) |
|---|---|---|---|
| Example 1 | 13.00 | 0.55 | 1480 |
| C/Example 1-1 | 12.30 | 0.96 | 1110 |
| C/Example 1-2 | 8.20 | 0.60 | 900 |
| C/Example 1-3 | 10.80 | 0.92 | 1150 |
| Example 2 | 16.10 | 0.72 | 13000 |
| C/Example 2-1 | 13.20 | 1.52 | 9000 |
| C/Example 2-2 | 10.30 | 1.12 | 8500 |
| Example 3 | 15.40 | 0.75 | 12600 |
| C/Example 3 | 12.60 | 1.56 | 8800 |

What is the claimed is:

1. An organic electroluminescence device, comprising two electrodes and a plurality of organic layers between the two electrodes, the organic layers including a light emitting layer that emits light when an electric field is applied between the two electrodes, wherein: the device further comprises a plurality of metal fine particles, which generates a local plasmon by emission light emitted from the light emitting layer, inside of at least either one of the two electrodes or adjacent to a side of the at least either one of the two electrodes facing the organic layers and inside of a conductive organic layer;
   wherein a maximum length d of the metal fine particles satisfies Formula (1) below:

$$d > \sqrt[3]{\frac{3\lambda^3 \mathrm{Im}\left[\frac{\hat{n}^2 - 1}{\hat{n}^2 + 1}\right]}{4\pi^3 n^3 \mathrm{Abs}\left[\frac{\hat{n}^2 - 1}{\hat{n}^2 + 1}\right]^2}}$$

$$\hat{n} = n_{particle}/n$$

where, λ is an emission wavelength, n is a refractive index of the conductive layer, and $n_{particle}$ is a complex refractive index of the metal fine particles; wherein the maximum length d has an upper value of 120 nm;
   at least some of the plurality of metal fine particles are located adjacent to the light emitting layer; and a scattering cross section $\sigma_S$ of the metal fine particles with respect to emission light emitted from the light emitting layer is larger than an absorption cross section $\sigma_A$ of the metal fine particles with respect to the emission light.

2. The organic electroluminescence device of claim 1, wherein a maximum length d of the metal fine particles is greater than a mean free path of electrons in a metal constituting the metal fine particles.

3. The organic electroluminescence device of claim 1, wherein the light emitting layer is formed of an organic phosphor material.

4. The organic electroluminescence device of claim 1, wherein the either one of the electrodes is formed of a transparent conductive material.

5. The organic electroluminescence device of claim 1, wherein the either one of the electrodes is formed of a conductive material which is less likely to generate a surface plasmon by the emission light than a metal constituting the metal fine particles.

6. The organic electroluminescence device of claim 1, wherein the metal fine particles account for not less than 5% of an area of the either one of the electrodes.

7. The organic electroluminescence device of claim 1, wherein the either one of the electrodes is formed on a substrate.

\* \* \* \* \*